US010203602B2

(12) United States Patent
Ryu et al.

(10) Patent No.: US 10,203,602 B2
(45) Date of Patent: Feb. 12, 2019

(54) COATING COMPOSITIONS FOR USE WITH AN OVERCOATED PHOTORESIST

(71) Applicant: Rohm and Haas Electronic Materials Korea Ltd., Cheonan, Chungcheongnam-Do (KR)

(72) Inventors: Eui-Hyun Ryu, Chungcheongnam-Do (KR); Myung-Yeol Kim, Chungcheongnam-Do (KR); EunHye Cho, Chungcheongnam-Do (KR); Jung-June Lee, Chungcheongnam-Do (KR); Jae Hwan Sim, Chungcheongnam-Do (KR)

(73) Assignee: Rohm and Haas Electronic Materials Korea Ltd., Cheonan, Chungcheongnam-do (KR)

( * ) Notice: Subject to any disclaimer, the term of this patent is extended or adjusted under 35 U.S.C. 154(b) by 0 days.

(21) Appl. No.: 15/283,248

(22) Filed: Sep. 30, 2016

(65) Prior Publication Data
US 2018/0095367 A1    Apr. 5, 2018

(51) Int. Cl.
*G03F 7/11* (2006.01)
*G03F 7/09* (2006.01)
*C08G 73/02* (2006.01)
*C08G 73/06* (2006.01)
*C09D 5/00* (2006.01)
*C09D 175/02* (2006.01)
*C09D 179/04* (2006.01)
*G03F 7/16* (2006.01)
*H01L 21/027* (2006.01)

(52) U.S. Cl.
CPC ......... *G03F 7/091* (2013.01); *C08G 73/0273* (2013.01); *C08G 73/06* (2013.01); *C08G 73/0638* (2013.01); *C09D 5/006* (2013.01); *C09D 175/02* (2013.01); *C09D 179/04* (2013.01); *G03F 7/11* (2013.01); *G03F 7/162* (2013.01); *G03F 7/168* (2013.01); *H01L 21/0276* (2013.01)

(58) Field of Classification Search
CPC . G03F 7/004; G03F 7/11; G03F 7/091; C08G 73/0273; C08G 73/06; C08G 73/0638; C08L 79/04; C09D 179/04; H01L 21/0276

USPC ............ 430/271.1, 322, 325, 330; 438/952; 528/422, 423; 525/417
See application file for complete search history.

(56) References Cited

U.S. PATENT DOCUMENTS

| 7,919,222 | B2 | 4/2011 | Vohra et al. |
| 8,968,981 | B2 | 3/2015 | Jain et al. |
| 9,244,352 | B2 | 1/2016 | Zampini et al. |
| 9,323,154 | B2 | 4/2016 | Zampini et al. |
| 2004/0110096 | A1 | 6/2004 | Kishioka et al. |
| 2006/0057491 | A1 | 3/2006 | Wayton et al. |
| 2006/0228646 | A1 | 10/2006 | Zampini et al. |
| 2010/0009293 | A1 | 1/2010 | Yao et al. |
| 2010/0009297 | A1* | 1/2010 | Yao ..................... C08G 73/0273 430/325 |
| 2010/0207276 | A1* | 8/2010 | Allen ................. H01L 21/02137 257/773 |
| 2010/0221657 | A1* | 9/2010 | Sakamoto .......... C08G 59/1438 430/270.1 |
| 2011/0033800 | A1* | 2/2011 | Zampini .............. C07D 251/32 430/271.1 |
| 2011/0033801 | A1* | 2/2011 | Zampini .............. C09D 167/02 430/271.1 |
| 2011/0200938 | A1* | 8/2011 | Yao ......................... G03F 7/091 430/280.1 |
| 2011/0250544 | A1* | 10/2011 | Liu ......................... G03F 7/091 430/325 |
| 2012/0202155 | A1* | 8/2012 | Yao ..................... C09D 161/24 430/311 |
| 2014/0030653 | A1 | 1/2014 | Zampini et al. |
| 2015/0185614 | A1 | 7/2015 | Sim et al. |
| 2016/0187778 | A1 | 6/2016 | Lee et al. |
| 2017/0283651 | A1 | 10/2017 | Sim et al. |

FOREIGN PATENT DOCUMENTS

EP    2343597 A2    7/2011

OTHER PUBLICATIONS

International Search Report and Written Opinion issued in PCT/IB2017/001360, dated Sep. 29, 2017.

* cited by examiner

*Primary Examiner* — Amanda C. Walke
(74) *Attorney, Agent, or Firm* — Mintz Levin Cohn Ferris Glovsky and Popeo, P.C.; Peter F. Corless

(57) ABSTRACT

Organic coating compositions, particularly antireflective coating compositions for use with an overcoated photoresist, are provided that comprise 1) one or more resins and 2) one or more substituted isocyanurate compounds that are distinct from the 1) one or more resins.

20 Claims, No Drawings

COATING COMPOSITIONS FOR USE WITH AN OVERCOATED PHOTORESIST

FIELD

The present invention relates to compositions and, in particular, antireflective coating compositions (for example, "BARCs"), for use in microelectronic applications. Compositions of the invention comprise one or more substituted isocyanurate compounds.

BACKGROUND

Photoresists are photosensitive films used for the transfer of images to a substrate. A coating layer of a photoresist is formed on a substrate and the photoresist layer is then exposed through a photomask to a source of activating radiation. Following exposure, the photoresist is developed to provide a relief image that permits selective processing of a substrate.

Reflection of activating radiation used to expose a photoresist often poses limits on resolution of the image patterned in the photoresist layer. Reflection of radiation from the substrate/photoresist interface can produce spatial variations in the radiation intensity in the photoresist, resulting in non-uniform photoresist linewidth upon development. Radiation also can scatter from the substrate/photoresist interface into regions of the photoresist where exposure is non-intended, again resulting in linewidth variations.

One approach used to reduce the problem of reflected radiation has been the use of a radiation absorbing layer interposed between the substrate surface and the photoresist coating layer. See U.S. 2016/0187778.

Electronic device manufacturers continually seek increased resolution of a photoresist image patterned over antireflective coating layers.

SUMMARY

We now provide new coating compositions that can be used with overcoated photoresist compositions. In preferred aspects, coating compositions of the invention can function as an effective antireflective layer for an overcoated resist layer.

Preferred coating compositions may comprise 1) one or more resins (sometimes referred to herein as matrix resins) and 2) one or more substituted isocyanurate compounds that are distinct from the 1) one or more resins.

Preferred isocyanurate compounds may have one or more substituents where each such substituent contains one or more O, S or N atoms. Typically preferred isocyanurate compounds may comprise 1, 2, 3 or 4 groups with extended heteroalkyl chains (e.g. chains of the formula —$(CH_2)_m(C=O)O((CH_2)_2O)_nCH_3$ where m is an integer of 1 to 4, more typically 1 or 2, and n is an integer of 1 to 12, more typically 2 to 6. Typically preferred isocyanurate compounds also suitably may comprise 1, 2, 3, 4, 5 or 6 isocyanurate groups, more typically 1, 2, 3 or 4 isocyanurate groups, still more typically 1 or 2 isocyanurate groups.

Particularly preferred isocyanurate compounds have structure of the following Formula (I):

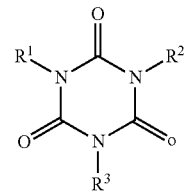

(I)

wherein $R^1$, $R^2$ and $R^3$ are each independently hydrogen or a non-hydrogen substituent, with at least one of $R^1$, $R^2$ and $R^3$ being a non-hydrogen substituent. Preferred $R^1$, $R^2$ and $R^3$ group each independently may be hydrogen or a substituent that comprises 1) one or more O, S, N or halogen atoms and 2) 6 or carbon atoms, groups that comprise 1) one or more oxygen atoms and 2) 6 or more carbon atoms.

Preferred substituted isocyanurate compounds may have relatively low molecular weights, for example, less than 3,000 daltons, or more typically less than 2000 daltons, or still more typically less than 1000 daltons. Suitably, a substituted isocyanurate compound has a molecular weight of at least 50, 100, 200, or 300 daltons, or even at least 400 or 500 daltons. In certain preferred aspects, a substituted isocyanurate compound is non-polymeric and may not include polyester linkages including extended (e.g. 10 or more) polyester linkages. Even if non-polymeric, a substituted isocyanurate compound suitably may comprise two or more isocyanurate groups (e.g., in the above Formula (I), one or more of $R^1$, $R^2$ and/or $R^3$ may comprise an isocyanurate group which in turn may comprise substituents as disclosed herein for $R^1$, $R^2$ and $R^3$).

In certain preferred aspects, the one or more resins also may comprise one or more isocyanurate moieties either as pendant groups or integral units of a resin chain.

Coating compositions of the invention also may comprise a crosslinker component that is distinct from the isocyanurate compound and the resin. In preferred crosslinking compositions, a coating layer of the composition may harden or crosslink upon thermal treatment of 60, 90, 120 or 180 second at 180° C., 200° C. or 250° C. or more.

For antireflective applications, underlying compositions of the invention also preferably contain a component that comprises chromophore groups that can absorb undesired radiation used to expose the overcoated resist layer from reflecting back into the resist layer. The matrix polymer or substituted isocyanurate compound may comprise such chromophore groups, or a coating composition may comprise a further component that comprises suitable chromophore groups.

In use with an overcoated photoresist, a coating composition may be applied on a substrate such as a semiconductor wafer which may have one or more organic or inorganic coating layers thereon. The applied coating layer may be optionally thermally treated prior to overcoating with a photoresist layer. In the case of crosslinking compositions, such thermal treatment may cause hardening including crosslinking of the coating composition layer. Such crosslinking may include hardening and/or covalent-bonding forming reactions between one or more composition components and can modulate water contact angle of the coating composition layer.

Thereafter, a photoresist composition may be applied over the coating composition layer followed by imaging of the applied photoresist composition layer with patterned activating radiation and the imaged photoresist composition layer is developed to provide a photoresist relief image.

A variety of photoresists may be used in combination (i.e. overcoated) with a coating composition of the invention. Preferred photoresists for use with the underlying coating compositions of the invention are chemically-amplified resists, especially positive-tone and negative-tone photoresists that contain one or more photoactive compounds and a resin component that contains units that undergo a deblocking or cleavage reaction in the presence of photogenerated acid.

In certain preferred aspects, the photoresist composition is designed for a negative-tone resist where the light-exposed regions remains after development process, but positive tone development can be also employed to remove the exposed portions of the photoresist layer.

The invention further provides methods for forming a photoresist relief image and novel articles of manufacture comprising substrates (such as a microelectronic wafer substrate) coated with a coating composition of the invention alone or in combination with a photoresist composition.

Other aspects of the invention are disclosed infra.

DETAILED DESCRIPTION

We now provide new organic coating compositions that are particularly useful with an overcoated photoresist layer. As discussed above, preferred coating compositions may comprise 1) a matrix polymer; and 2) a substituted isocyanurate compound. Preferred coating compositions of the invention may be applied by spin-coating (spin-on compositions) and formulated as a solvent composition. The coating compositions of the invention are especially useful as antireflective compositions for an overcoated photoresist and/or as planarizing or via-fill compositions for an overcoated photoresist composition coating layer.

Particularly preferred isocyanurate compounds have structure of the following Formula (I):

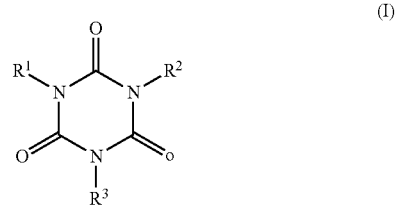

wherein $R^1$, $R^2$ and $R^3$ are each independently hydrogen or a non-hydrogen substituent, with at least one of $R^1$, $R^2$ and $R^3$ being a non-hydrogen substituent. Preferred $R^1$, $R^2$ and $R^3$ group each independently may be hydrogen or a substituent that comprises 1) one or more O, S, N or halogen atoms and 2) 6 or carbon atoms, groups that comprise 1) one or more oxygen atoms and 2) 6 or more carbon atoms. Heteroalkyl groups that comprise such O, S and/or N atoms, particularly oxygen atoms, and such 6 or more carbon atoms are particularly preferred, including heteroalkyl groups that may comprise a carbonyl or ketoalkyl (e.g. 1, 2 or 3 carbonyl groups and 1, 2, 3, 4, 5, or 6 or more carbon atoms) substitution such as a moiety $-(CH_2)_m(C=O)O((CH_2)_2O)_nCH_3$ where m is an integer of 1 to 4, more typically 1 or 2, and n is an integer of 1 to 12, more typically 2 to 6.

Specifically preferred substituted isocyanurate compounds include the following:

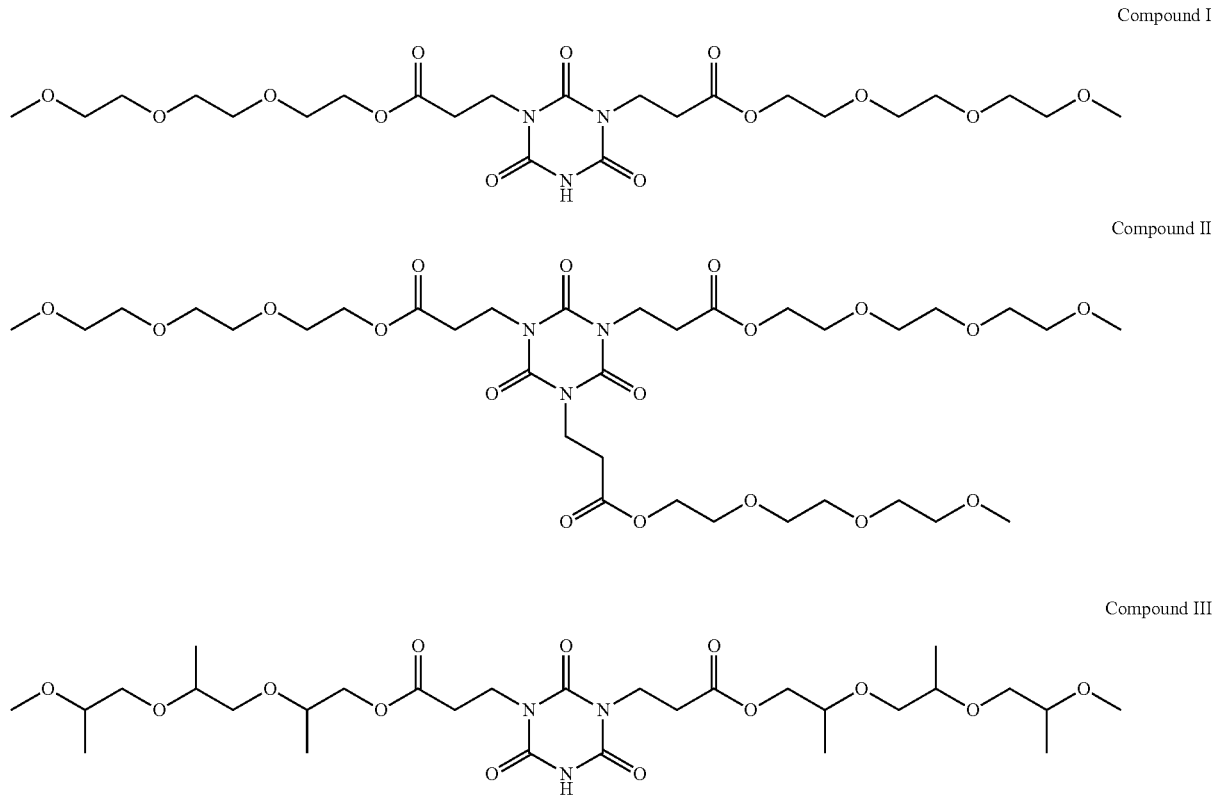

Compound IV

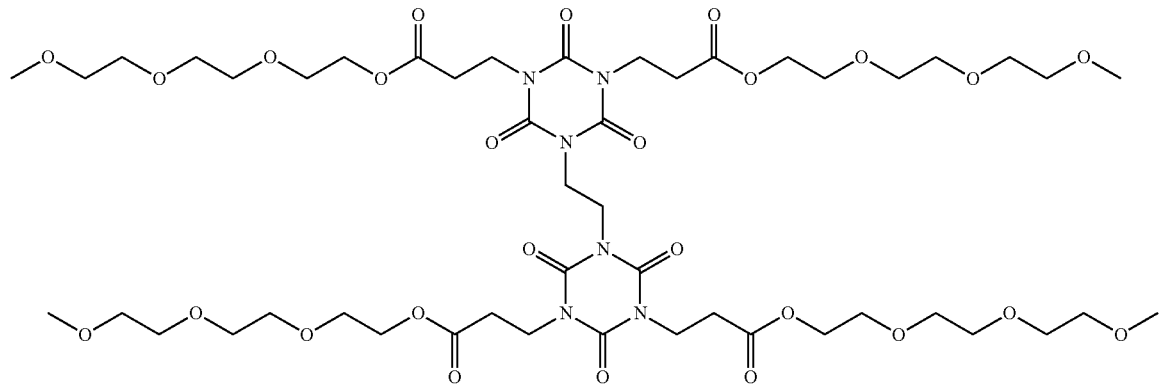

As referred to herein, suitable heteroalkyl groups include optionally substituted C1-20alkoxy, optionally substituted alkylthio preferably having 1 to about 20 carbon atoms; optionally substituted alkylsulfinyl preferably 1 to about 20 carbon atoms; optionally substituted alkylsulfonyl preferably having 1 to about 20 carbon atoms; and optionally substituted alkylamine preferably having 1 to about 20 carbon atoms.

Various materials and substituents that are "optionally substituted" may be suitably substituted at one or more available positions by e.g. halogen (F, Cl, Br, I); nitro; hydroxy; amino; alkyl such as $C_{1-4}$alkyl; alkenyl such as $C_{2-8}$ alkenyl; alkylamino such as $C_{1-8}$ alkylamino; carbocyclic aryl such as phenyl, naphthyl, anthracenyl, etc; and the like.

Preferably, the one or more resins and one or more substituted isocyanurate compounds are distinct materials, i.e. the one or more resins and the one or more substituted isocyanurate compounds are not covalently linked.

One or more substituted isocyanurate compounds are suitably present in a coating composition in an amount of from 0.1 weight percent to 10, 15, 20, 30, 40 or more weight percent based on weight of total solids of a coating composition, more typically from 1, 2, or 3 weight percent to 5, 10, 15, or 20 or more weight percent based on weight of total solids of a coating composition. Total solids as referred to herein A variety of resins may serve as the matrix polymer of an underlying coating composition.

Particularly preferred matrix resins of coating compositions of the invention may comprise polyester linkages. Polyester resins can be readily prepared by reaction of one or more polyol reagents with one or more carboxy-containing (such as a carboxylic acid, ester, anhydride, etc.) compounds. Suitable polyol reagents include diols, glycerols and triols such as e.g. diols such as diol is ethylene glycol, 1,2-propylene glycol, 1,3-propylene glycol, butane diol, pentane diol, cyclobutyl diol, cyclopentyl diol, cyclohexyl diol, dimethylolcyclohexane, and triols such as glycerol, trimethylolethane, trimethylolpropane and the like.

Matrix resins of coating compositions of the invention may comprise a variety of additional groups such as cyanurate groups, as disclosed in U.S. Pat. Nos. 6,852,421 and 8,501,383.

Particularly preferred matrix resins of coating compositions of the invention may comprise one or more one or more cyanurate groups and polyester linkages.

As discussed, for antireflective applications, suitably one or more of the compounds reacted to form the resin comprise a moiety that can function as a chromophore to absorb radiation employed to expose an overcoated photoresist coating layer. For example, a phthalate compound (e.g. a phthalic acid or dialkyl phthalate (i.e. di-ester such as each ester having 1-6 carbon atoms, preferably a di-methyl or ethyl phthalate) may be polymerized with an aromatic or non-aromatic polyol and optionally other reactive compounds to provide a polyester particularly useful in a coating composition employed with a photoresist imaged at sub-200 nm wavelengths such as 193 nm. An isocyanurate compound also may be polymerized with one or more polyols to provide a resin useful in the present underlying coating compositions. Resins to be used in compositions with an overcoated photoresist imaged at sub-300 nm wavelengths or sub-200 nm wavelengths such as 248 nm or 193 nm, a naphthyl compound may be polymerized, such as a naphthyl compound containing one or two or more carboxyl substituents e.g. dialkyl particularly di-$C_{1-6}$alkyl naphthalenedicarboxylate. Reactive anthracene compounds also are preferred, e.g. an anthracene compound having one or more carboxy or ester groups, such as one or more methyl ester or ethyl ester groups.

The compound that contains a chromophore unit also may contain one or preferably two or more hydroxy groups and be reacted with a carboxyl-containing compound. For example, a phenyl compound or anthracene compound having one, two or more hydroxyl groups may be reacted with a carboxyl-containing compound.

Additionally, underlying coating compositions that are employed for antireflective purposes may contain a material that contains chromophore units that is separate from a resin component that provides water contact angle modulation (e.g. a resin that contains photoacid-labile groups and/or base-reactive groups. For instance, the coating composition may comprise a polymeric or non-polymeric compound that contains phenyl, anthracene, naphthyl, etc. units. It is often preferred, however, that the one or more resins that provide water contact angle modulation also contain chromophore moieties.

Preferably matrix resins of underlying coating compositions of the invention will have a weight average molecular weight (Mw) of about 1,000 to about 10,000,000 daltons, more typically about 2,000 to about 100,000 daltons, and a number average molecular weight (Mn) of about 500 to about 1,000,000 daltons. Molecular weights (either Mw or Mn) of the polymers of the invention are suitably determined by gel permeation chromatography.

The matrix polymer will be the major solids component of an underlying coating composition in many preferred embodiments. For instance, the matrix polymer suitably may be present from 50 to 99.9 weight percent based on total solid content of a coating composition, more typically from 80 to 95 weight percent based total solid content of a coating composition. As referred to herein, solids of a coating composition refer to all materials of the coating composition except solvent carrier.

As mentioned, preferred underlying coating compositions of the invention can be crosslinked, e.g. by thermal and/or radiation treatment. For example, preferred underlying coating compositions of the invention may contain a separate crosslinker component that can crosslink with one or more other components of the coating composition. Generally preferred crosslinking coating compositions comprise a separate crosslinker component.

A variety of crosslinkers may be employed, including those crosslinkers disclosed in European Application 542008. For example, suitable coating composition crosslinkers include amine-based crosslinkers such as melamine materials, including melamine resins such as manufactured by Cytec Industries and sold under the tradename of Cymel 300, 301, 303, 350, 370, 380, 1116 and 1130. Glycolurils are particularly preferred including glycolurils available from Cytec Industries. Benzoquanamines and urea-based materials also will be suitable including resins such as the benzoquanamine resins available from Cytec Industries under the name Cymel 1123 and 1125, and urea resins available from Cytec Industries under the names of Powderlink 1174 and 1196. In addition to being commercially available, such amine-based resins may be prepared e.g. by the reaction of acrylamide or methacrylamide copolymers with formaldehyde in an alcohol-containing solution, or alternatively by the copolymerization of N-alkoxymethyl acrylamide or methacrylamide with other suitable monomers.

A crosslinker component of a coating composition of the invention in general is present in an amount of between about 5 and 50 weight percent of total solids (all components except solvent carrier) of the coating composition, more typically in an amount of about 5 to 25 weight percent total solids.

Particularly preferred coating compositions of the invention also may contain a thermal acid generator compound. Thermal-induced crosslinking of the coating composition by activation of the thermal acid generator is generally preferred.

Suitable thermal acid generator compounds for use in a coating composition include ionic or substantially neutral thermal acid generators, e.g. an ammonium arenesulfonate salt (e.g. toluene sulfonic acid ammonium salt), for catalyzing or promoting crosslinking during curing of an antireflective composition coating layer. Typically one or more thermal acid generators are present in an coating composition in a concentration from about 0.1 to 10 percent by weight of the total of the dry components of the composition (all components except solvent carrier), more preferably about 0.5 to 2 percent by weight of the total dry components.

Coating compositions of the invention, particularly for reflection control applications, also may contain additional dye compounds that absorb radiation used to expose an overcoated photoresist layer. Other optional additives include surface leveling agents, for example, the leveling agent available under the tradename Silwet 7604, or the surfactant FC 171 or FC 431 available from the 3M Company.

Underlying coating compositions of the invention also may contain other materials such as a photoacid generator, including a photoacid generator as discussed for use with an overcoated photoresist composition. See U.S. Pat. No. 6,261,743 for a discussion of such use of a photoacid generator in an antireflective composition.

To make a liquid coating composition of the invention, the components of the coating composition are dissolved in a suitable solvent such as, for example, one or more oxyisobutyric acid esters particularly methyl-2-hydroxyisobutyrate, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol, and ethoxy propanol; methyl 2-hydroxyisobutyrate; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyro lactone. The concentration of the dry components in the solvent will depend on several factors such as the method of application. In general, the solid content of an underlying coating composition varies from about 0.5 to 20 weight percent of the total weight of the coating composition, preferably the solid content varies from about 0.5 to 10 weight of the coating composition.

Exemplary Photoresist Systems

Photoresists for use with an underlying coating composition typically comprise a polymer and one or more acid generators. Generally preferred are positive-tone resists and the resist polymer has functional groups that impart alkaline aqueous solubility to the resist composition. For example, preferred are polymers that comprise polar functional groups such as hydroxyl or carboxylate, or acid-labile groups that can liberate such polar moieties upon lithographic processing. Preferably the polymer is used in a resist composition in an amount sufficient to render the resist developable with an aqueous alkaline solution.

Acid generators are also suitably used with polymers that comprise repeat units containing aromatic groups, such as optionally substituted phenyl including phenol, optionally substituted naphthyl, and optionally substituted anthracene. Optionally substituted phenyl (including phenol) containing polymers are particularly suitable for many resist systems, including those imaged with EUV and e-beam radiation. For positive-acting resists, the polymer also preferably contains one or more repeat units that comprise acid-labile groups. For example, in the case of polymers containing optionally substituted phenyl or other aromatic groups, a polymer may comprise repeat units that contain one or more acid-labile moieties such as a polymer that is formed by polymerization of monomers of an acrylate or methacrylate compound with acid-labile ester (e.g. t-butyl acrylate or t-butyl methacrylate). Such monomers may be copolymerized with one or more other monomers that comprise aromatic group(s) such as optionally phenyl, e.g. a styrene or vinyl phenol monomer.

Preferred monomers used for the formation of such polymers include: an acid-labile monomer having the following formula (V), a lactone-containing monomer of the following formula (VI), a base-soluble monomer of the following formula (VII) for adjusting dissolution rate in alkaline developer, and an acid-generating monomer of the following formula (VIII), or a combination comprising at least one of the foregoing monomers:

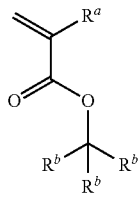
(V)

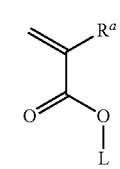
(VI)

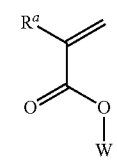
(VII)

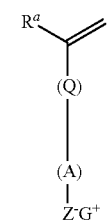
(VIII)

wherein each $R^a$ is independently H, F, —CN, $C_{1-10}$ alkyl, or $C_{1-10}$ fluoroalkyl. In the acid-deprotectable monomer of formula (V), $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to an adjacent $R^b$ to form a cyclic structure. In lactone-containing monomer of formula (VI), L is a monocyclic, polycyclic, or fused polycyclic $C_{4-20}$ lactone-containing group. In the base solubilizing monomer of formula (VII), W is a halogenated or non-halogenated, aromatic or non-aromatic $C_{2-50}$ hydroxyl-containing organic group having a pKa of less than or equal to 12. In the acid generating monomer of formula (VIII), Q is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non-ester-containing and fluorinated or non-fluorinated, and is $C_{1-20}$ alkyl, $C_{3-20}$ cycloalkyl, $C_{6-20}$ aryl, or $C_{7-20}$ aralkyl, $Z^-$ is an anionic moiety comprising carboxylate, sulfonate, an anion of a sulfonamide, or an anion of a sulfonimide, and $G^+$ is a sulfonium or iodonium cation.

Exemplary acid-deprotectable monomers include but are not limited to:

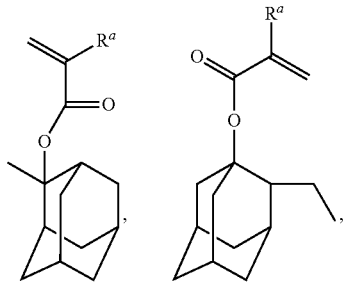

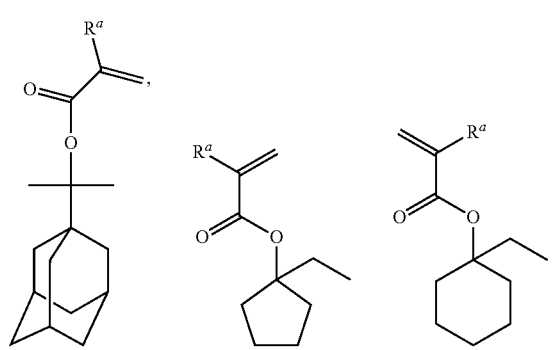

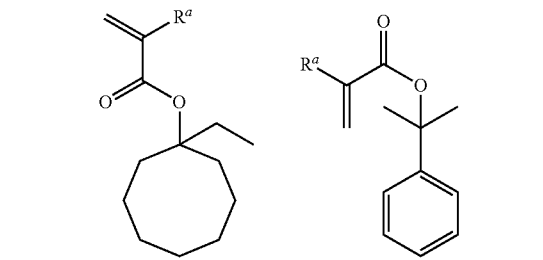

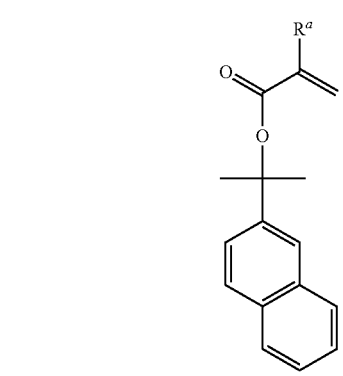

or a combination comprising at least one of the foregoing, wherein $R^a$ is H, F, —CN, $C_{1-6}$ alkyl, or $C_{1-6}$ fluoroalkyl.

Suitable lactone monomers may be of the following formula (IX):

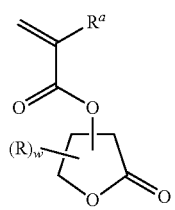
(IX)

wherein $R^a$ is H, F, —CN, $C_{1-6}$ alkyl, or $C_{1-6}$ fluoroalkyl, R is a $C_{1-10}$ alkyl, cycloalkyl, or heterocycloalkyl, and w is an integer of 0 to 5. In formula (IX), R is attached directly to the lactone ring or commonly attached to the lactone ring and/or one or more R groups, and the ester moiety is attached to the lactone ring directly, or indirectly through R.

Exemplary lactone-containing monomers include:

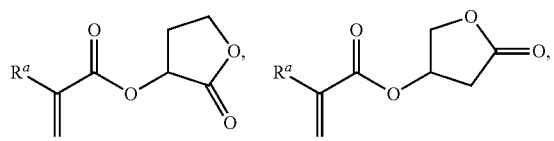

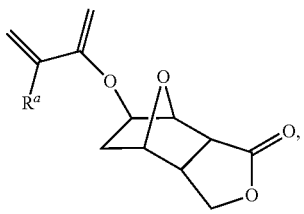

or a combination comprising at least one of the foregoing monomers, wherein $R^a$ is H, F, —CN, $C_{1-10}$ alkyl, or $C_{1-10}$ fluoroalkyl.

Suitable base-soluble monomers may be of the following formula (X):

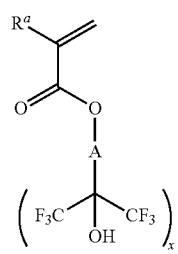
(X)

wherein each $R^a$ is independently H, F, —CN, $C_{1-10}$ alkyl, or $C_{1-10}$ fluoroalkyl, A is a hydroxyl-containing or non-hydroxyl containing, ester-containing or non ester-containing, fluorinated or non-fluorinated $C_{1-20}$ alkylene, $C_{3-20}$ cycloalkylene, $C_{6-20}$ arylene, or $C_{7-20}$ aralkylene, and x is an integer of from 0 to 4, wherein when x is 0, A is a hydroxyl-containing $C_{6-20}$ arylene.

Exemplary base soluble monomers include those having the following structures:

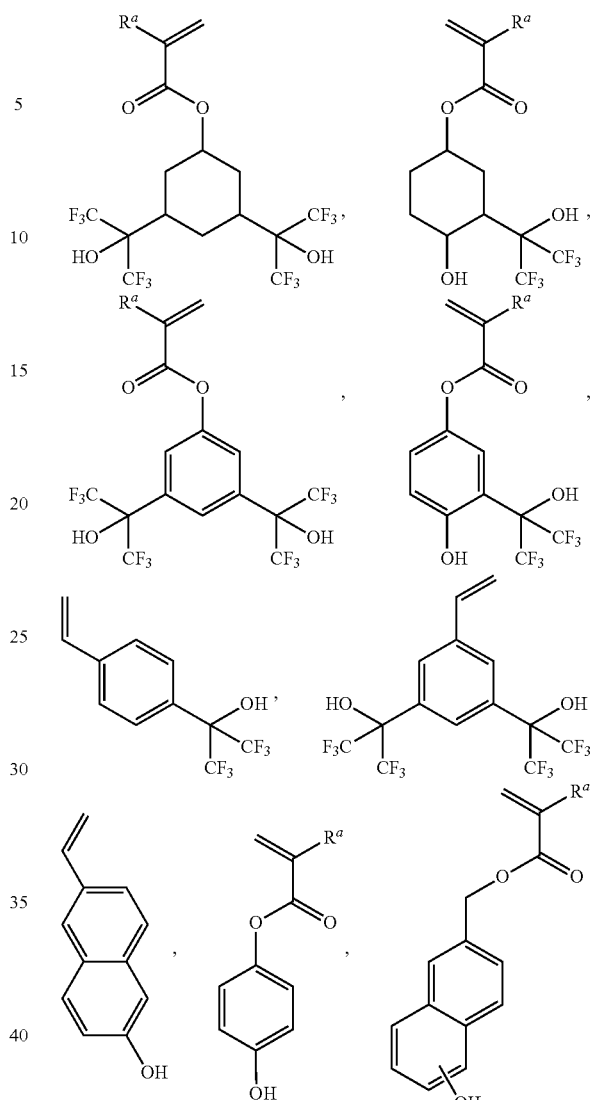

or a combination comprising at least one of the foregoing, wherein $R^a$ is H, F, —CN, $C_{1-6}$ alkyl, or $C_{1-6}$ fluoroalkyl.

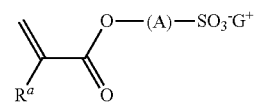
(XI)

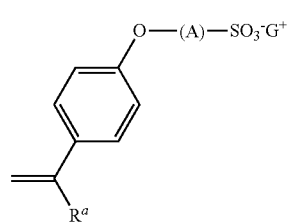
(XII)

Preferred acid generating monomers include those of the formulae (XI) or (XII): wherein each $R^a$ is independently H, F, —CN, $C_{1-6}$alkyl, or $C_{1-6}$ fluoroalkyl, A is a fluorine-substituted $C_{1-30}$alkylene group, a fluorine-substituted $C_{3-30}$ cycloalkylene group, a fluorine-substituted $C_{6-30}$ arylene group, or a fluorine-substituted $C_{7-30}$ alkylene-arylene group, and $G^+$ is a sulfonium or iodonium cation.

Preferably, in formulas (XI) and (XII), A is a —[(C(R$^1$)$_2$)xC(=O)O]$_b$—C((R$^2$)$_2$)$_y$(CF$_2$)z- group, or an o-, m- or p-substituted —C$_6$F$_4$— group, where each R$^1$ and R$^2$ are each independently H, F, —CN, $C_{1-6}$ fluoroalkyl, or $C_{1-6}$ alkyl, b is 0 or 1, x is an integer of 1 to 10, y and z are independently integers of from 0 to 10, and the sum of y+z is at least 1.

Exemplary preferred acid generating monomers include:

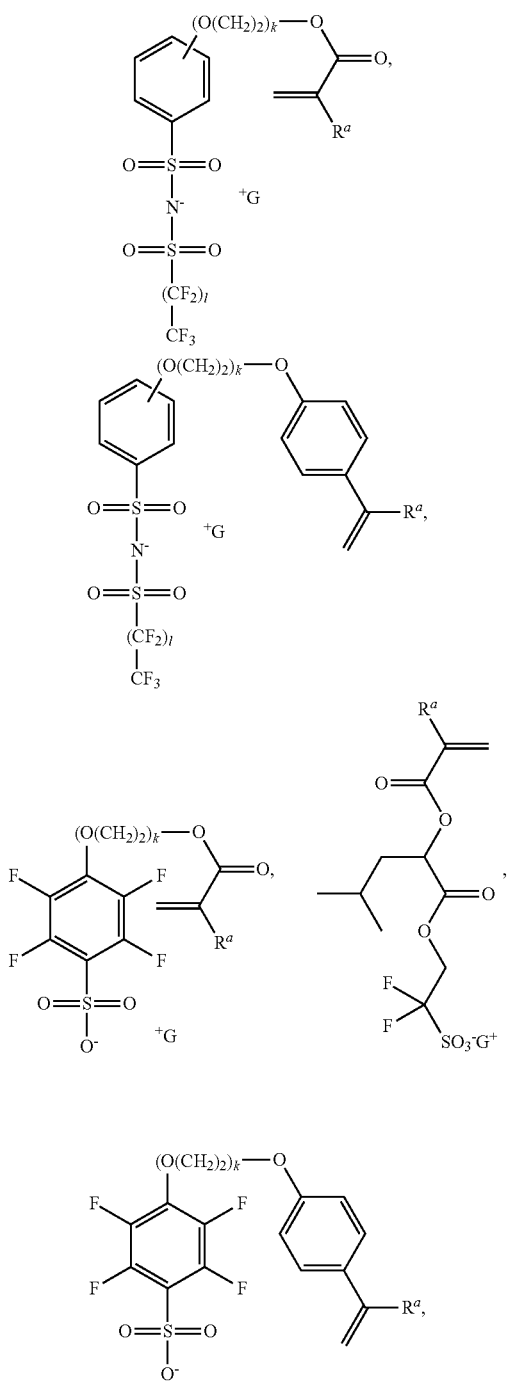

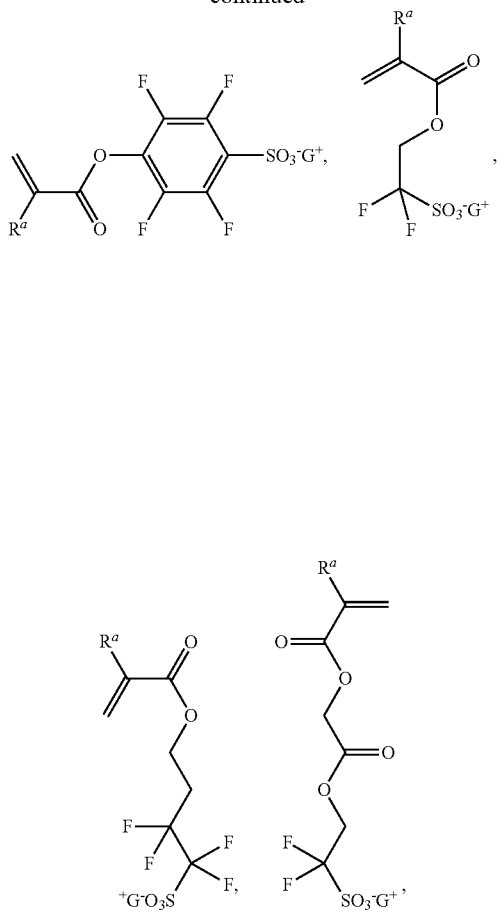

or a combination comprising at least one of the foregoing, where each $R^a$ is independently H, F, —CN, $C_{1-6}$ alkyl, or $C_{1-6}$ fluoroalkyl, k is suitably an integer of from 0 to 5; and $G^+$ is a sulfonium or iodonium cation. $G^+$ as referred to herein throughout the various formulae may be an acid generator as disclosed herein and comprise an oxo-dioxolane moiety and/or an oxo-dioxane moiety.

Preferred acid-generating monomers may include sulfonium or iodonium cation. Preferably, in formula (IV), $G^+$ is of the formula (XIII):

(XIII)

wherein X is S or I, each $R^o$ is halogenated or non-halogenated and is independently $C_{1-30}$ alkyl group; a polycyclic or monocyclic $C_{3-30}$ cycloalkyl group; a polycyclic or monocyclic $C_{4-30}$ aryl group; or a combination comprising at least one of the foregoing, wherein when X is S, one of the $R^o$ groups is optionally attached to one adjacent $R^o$ group by a single bond, and a is 2 or 3, wherein when X is I, a is 2, or when X is S, a is 3.

Exemplary acid generating monomers include those having the formulas:

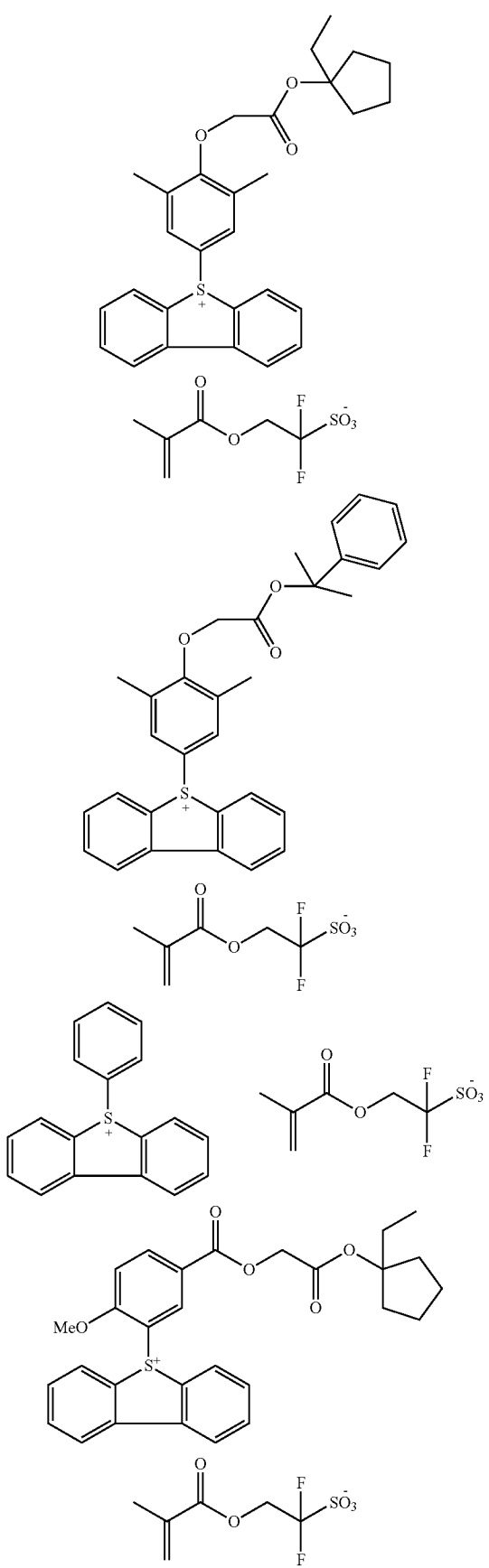
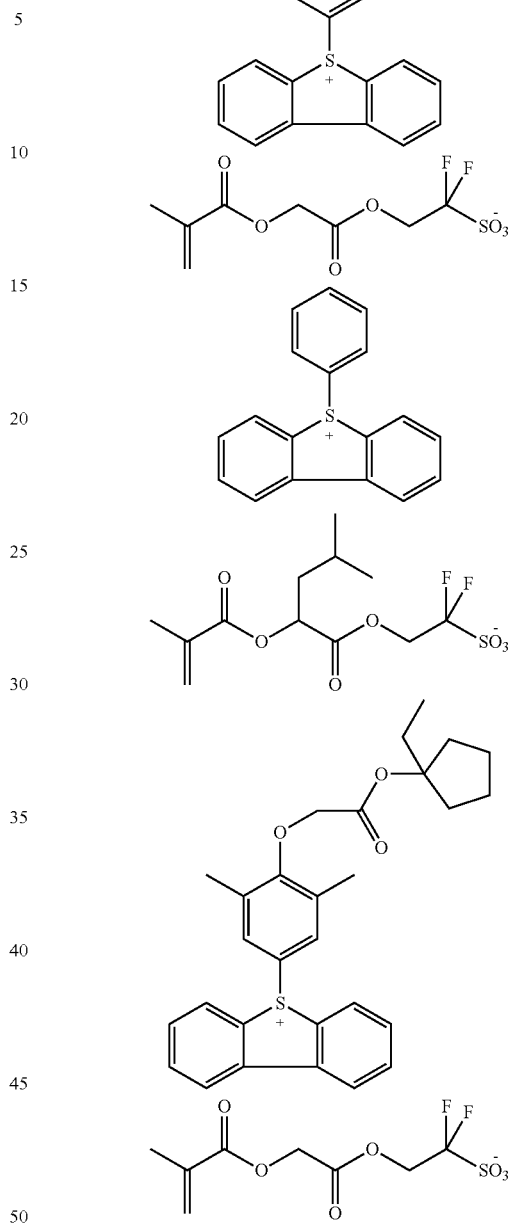

Specifically suitable polymers that have acid-labile deblocking groups for use in a positive-acting chemically-amplified photoresist of the invention have been disclosed in European Patent Application 0829766A2 (polymers with acetal and ketal polymers) and European Patent Application EP0783136A2 (terpolymers and other copolymers including units of 1) styrene; 2) hydroxystyrene; and 3) acid labile groups, particularly alkyl acrylate acid labile groups.

Additional preferred resins for use in photoresists to be imaged at sub-200 nm, such as at 193 nm, comprises units of the following general formulae (I), (II) and (III):

Preferred resins for use in photoresists to be imaged at sub-200 nm, such as at 193 nm, comprise units of the following general formulae (I), (II) and (III):

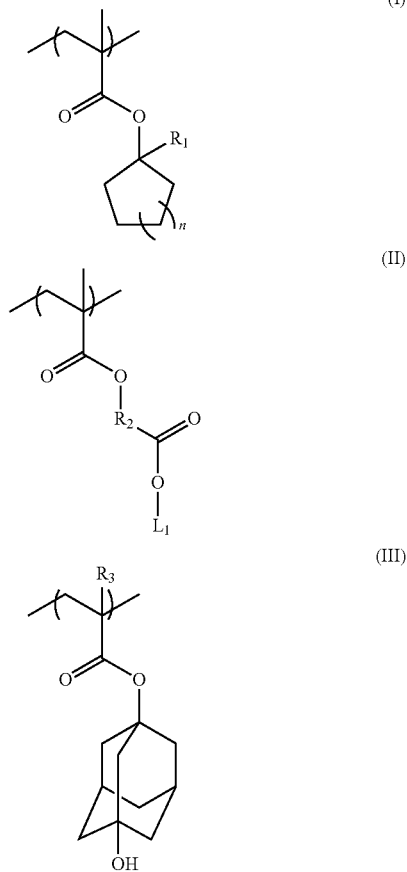

wherein: $R_1$ is a $(C_1-C_3)$alkyl group; $R^2$ is a $(C_1-C_3)$alkylene group; Li is a lactone group; and n is 1 or 2.

Polymers for use in photoresists of the invention may suitably vary widely in molecular weight and polydisperity. Suitable polymers include those that have an $M_w$, of from about 1,000 to about 50,000, more typically about 2,000 to about 30,000 with a molecular weight distribution of about 3 or less, more typically a molecular weight distribution of about 2 or less.

Preferred negative-acting compositions of the invention comprise a mixture of materials that will cure, crosslink or harden upon exposure to acid, and two or more acid generators as disclosed herein. Preferred negative acting compositions comprise a polymer binder such as a phenolic or non-aromatic polymer, a crosslinker component and a photoactive component of the invention. Such compositions and the use thereof have been disclosed in European Patent Applications 0164248 and U.S. Pat. No. 5,128,232 to Thackeray et al. Preferred phenolic polymers for use as the polymer binder component include novolaks and poly(vinylphenol)s such as those discussed above. Preferred crosslinkers include amine-based materials, including melamine, glycolurils, benzoguanamine-based materials and urea-based materials. Melamine-formaldehyde polymers are often particularly suitable. Such crosslinkers are commercially available, e.g. the melamine polymers, glycoluril polymers, urea-based polymer and benzoguanamine polymers, such as those sold by Cytec under tradenames Cymel 301, 303, 1170, 1171, 1172, 1123 and 1125 and Beetle 60, 65 and 80.

Particularly preferred photoresists of the invention may be used in immersion lithography applications. See, for example, U.S. Pat. No. 7,968,268 to Rohm and Haas Electronic Materials for a discussion of preferred immersion lithography photoresists and methods.

Photoresists of the invention also may comprise a single acid generator or a mixture of distinct acid generators, typically a mixture of 2 or 3 different acid generators, more typically a mixture that consists of a total of 2 distinct acid generators. The photoresist composition comprises an acid generator employed in an amount sufficient to generate a latent image in a coating layer of the composition upon exposure to activating radiation. For example, the acid generator will suitably be present in an amount of from 1 to 20 wt % based on total solids of the photoresist composition.

Suitable acid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyediazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine.

As referred to herein, acid generators can produce an acid when exposed to activating radiation, such as EUV radiation, e-beam radiation, 193 nm wavelength radiation or other radiation sources. Acid generator compounds as referred to herein also may be referred to as photoacid generator compounds.

Photoresists of the invention also may contain other materials. For example, other optional additives include actinic and contrast dyes, anti-striation agents, plasticizers, speed enhancers and sensitizers. Such optional additives typically will be present in minor concentration in a photoresist composition.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as tripropylamine, dodecylamine, tris(2-hydroxypropyl)amine, oltetrakis (2-hydroxypropyl)ethylenediamine; aryl amines such as diphenylamine, triphenylamine, aminophenol, and 2-(4-aminophenyl)-2-(4-hydroxyphenyl)propane, a hindered amine such as diazabicycloundecene (DBU) or diazabicyclononene (DBN), or ionic quenchers including quaternary alkyl ammonium salts such as tetrabutylammonium hydroxide (TBAH) or tetrabutylammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

Lithographic Processing

In use, a coating composition of the invention is applied as a coating layer to a substrate by any of a variety of methods such as spin coating. The coating composition in general is applied on a substrate with a dried layer thickness of between about 0.02 and 0.5 μm, preferably a dried layer thickness of between about 0.04 and 0.20 μm. The substrate is suitably any substrate used in processes involving photoresists. For example, the substrate can be silicon, silicon dioxide or aluminum-aluminum oxide microelectronic wafers. Gallium arsenide, silicon carbide, ceramic, quartz or copper substrates may also be employed. Substrates for liquid crystal display or other flat panel display applications are also suitably employed, for example glass substrates, indium tin oxide coated substrates and the like. Substrates for optical and optical-electronic devices (e.g. waveguides) also can be employed.

Preferably the applied coating layer is cured before a photoresist composition is applied over the underlying coating composition. Cure conditions will vary with the components of the underlying coating composition. Particularly the cure temperature will depend on the specific acid or acid (thermal) generator that is employed in the coating composition. Typical cure conditions are from about 80° C. to 225° C. for about 0.5 to 5 minutes. Cure conditions preferably render the coating composition coating layer substantially insoluble to the photoresist solvent as well the developer solution to be used.

After such curing, a photoresist is applied above the surface of the applied coating composition. As with application of the bottom coating composition layer(s), the overcoated photoresist can be applied by any standard means such as by spinning, dipping, meniscus or roller coating. Following application, the photoresist coating layer is typically dried by heating to remove solvent preferably until the resist layer is tack free. Optimally, essentially no intermixing of the bottom composition layer and overcoated photoresist layer should occur.

The resist layer is then imaged with activating radiation such as 248 nm, 193 nm or EUV radiation through a mask in a conventional manner. The exposure energy is sufficient to effectively activate the photoactive component of the resist system to produce a patterned image in the resist coating layer. Typically, the exposure energy ranges from about 3 to 300 $mJ/cm^2$ and depending in part upon the exposure tool and the particular resist and resist processing that is employed. The exposed resist layer may be subjected to a post-exposure bake if desired to create or enhance solubility differences between exposed and unexposed regions of a coating layer. For example, negative acid-hardening photoresists typically require post-exposure heating to induce the acid-promoted crosslinking reaction, and many chemically amplified positive-acting resists require post-exposure heating to induce an acid-promoted deprotection reaction. Typically post-exposure bake conditions include temperatures of about 50° C. or greater, more specifically a temperature in the range of from about 50° C. to about 160° C.

The photoresist layer also may be exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The exposed photoresist layer is then treated with a suitable developer capable of selectively removing portions of the film to form a photoresist pattern. In a negative tone development process, unexposed regions of a photoresist layer can be selectively removed by treatment with a suitable nonpolar solvent. See U.S. 2011/0294069 for suitable procedures for negative tone development. Typical nonpolar solvents for negative tone development are organic developers, such as a solvent chosen from ketones, esters, hydrocarbons, and mixtures thereof, e.g. acetone, 2-hexanone, 2-heptanone, methyl acetate, butyl acetate, and tetrahydrofuran. Photoresist materials used in the NTD process preferably form a photoresist layer that can form a negative image with organic solvent developer or a positive image with aqueous base developer such as tetraalkylammonium hydroxide solution. Preferably, the NTD photoresist is based on a polymer having acid sensitive (deprotectable) groups which, when deprotected, form carboxylic acid groups and/or hydroxyl groups.

Alternatively, development of the exposed photoresist layer can be accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone).

Preferably, the photoresist is positive tone based on a polymer having acid sensitive (deprotectable) groups which form carboxylic acid groups when deprotected, and the developer is preferably a metal-ion free tetraalkylammonium hydroxide solution, such as, for example, aqueous 0.26 N tetramethylammonium hydroxide. A pattern forms by developing.

The developed substrate may then be selectively processed on those substrate areas bared of photoresist, for example, chemically etching or plating substrate areas bared of photoresist in accordance with procedures well known in the art. Suitable etchants include a hydrofluoric acid etching solution and a plasma gas etch such as an oxygen plasma etch. A plasma gas etch removes the underlying coating layer.

The following non-limiting examples are illustrative of the invention.

Example 1: Synthesis of Compound 1

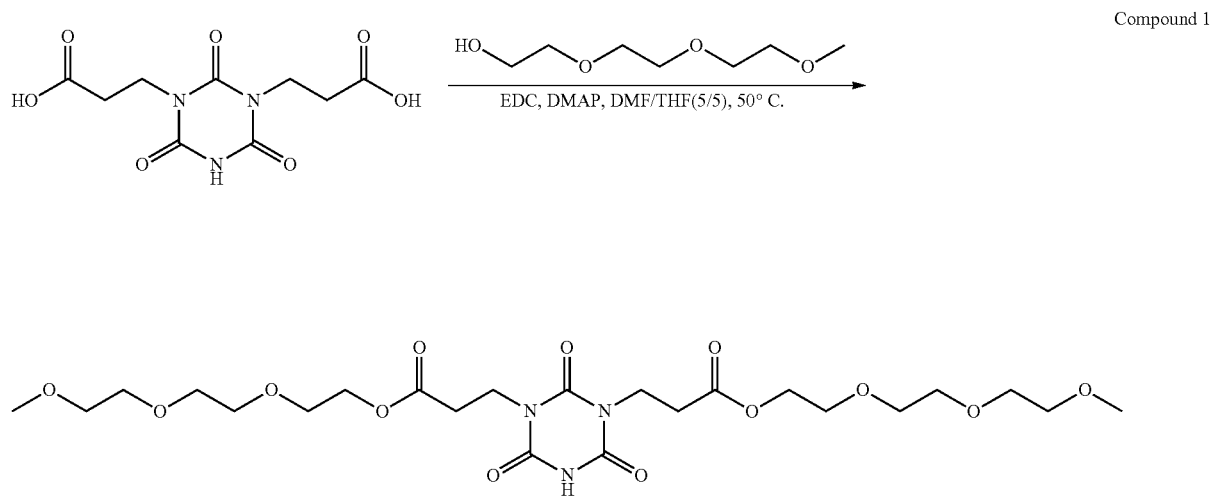

Compound 1

BCEIC (Bis(2-carboxyethyl) iso-cyanurate (5.33 g, 19.50 mmol, 1 eq), in 60 ml of THF/DMF(5/5) was dissolved. Then tri-ethylene glycol monomethyl ether (7.04 g, 42.92 mmol, 2.2 eq), EDC (1-(3-dimethylaminopropyl)-3-ethyl-carbodiimide) (8.6 g, 44.87 mmol, 2.3 eq), DMAP (4-dimethylaminopyridine) (5.48 g, 44.87 mmol, 2.3 eq) were added to the solution and the mixture was heated at 50° C. for 16 h. After the reaction was over, solid was filtered off and liquid was removed. Around 200 ml CHCl3/IPA(4:1) were used to extract with mixture and organic phase was washed by water, NH4Cl(aq), 1N HCl(aq) and brine solution. After being dried by MgSO4 filtered off and concentrated under reduced pressure to provide the Compound 1 shown in the above Scheme of this Example 1.

Example 2: Synthesis of Compound 2

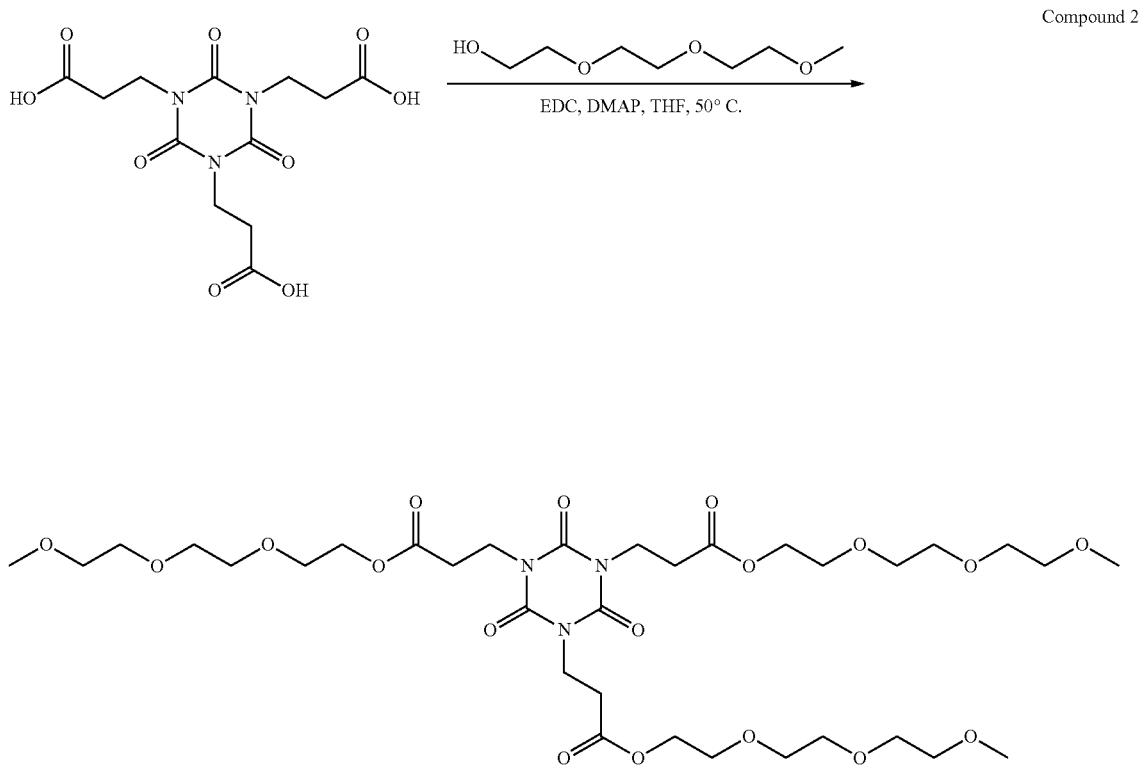

Compound 2

TCEIC (Tris(2-carboxyethyl)iso-cyanurate (3.0 g, 8.68 mmol, 1 eq), in 30 ml of THF was dissolved. Then triethylene glycol monomehtyl ether (4.7 g, 28.67 mmol, 3.3 eq), EDC (1-(3-dimethylaminopropyl)-3-ethylcarbodiimide) (5.66 g, 29.54 mmol, 3.4 eq), DMAP (4-dimethylaminopyridine) (3.61 g, 29.54 mmol, 3.4 eq) were added to the solution and the mixture was heated at 50° C. for 16 h. After the reaction was over, solid was filtered off and liquid was removed. Around 200 ml CH2Cl2 was used to extract with mixture and organic phase was washed by water, NH4Cl (aq), 1N HCl(aq), 1N NaOH(aq) and brine solution. After being dried by anhydrous MgSO4 filtered off and concentrated under reduced pressure to provide the Compound 2 shown in the above Scheme of this Example 2. Compound 2 was obtained colorless viscous oil in 4.5 g, yield (66%) $^1$H NMR (600 MHz, DMSO-d6): δ (ppm) 4.13 (t, 6H), 3.99 (t, 6H), 3.60 (t, 6H), 3.55-3.45 (m, 18H), 3.42 (t, 6H), 3.23 (s, 9H), 2.61 (t, 6H)

Example 3: Synthesis of Compound 3

Compound 3

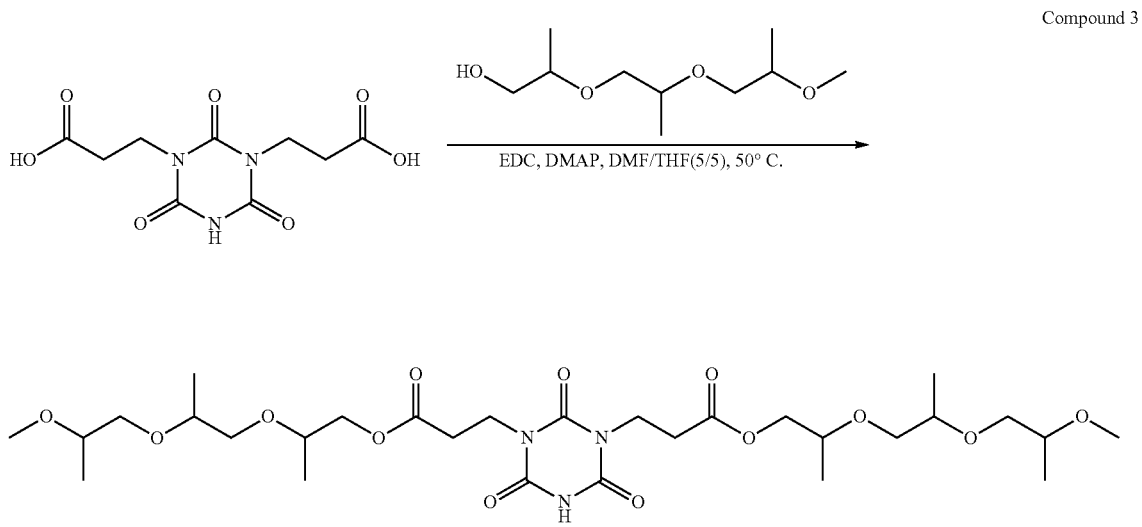

A 100 mL round bottom flask was charged with bis(2-carboxyethyl)isocyanurate (5.001 g, 0.0183 mol), propylene glycol monomethyl ether (5.878 g, 0.0285 mol) and mixture of 50 mL of DMF/THF(1/1). A mixture of 10 mL of DMF, EDC.HCl (7.016 g, 0.0366 mol) and DMAP (4.024 g, 0.03294 mol) was added slowly. The reaction mixture was heated to 50° C. and stirring was continued for 24 hours. The resulting solution was allowed to cool to RT and evaporated DMF under reduced pressure. The crude product was extracted with mixture of CHCl3/IPA (4/1) and organic phase was washed with NH4Cl, distilled water, and brine several times. The mixture solution was dried over anhydrous Mg2SO4 and concentrated. The residue was purified by silica gel column chromatography starting from hexane and eluting the product by a gradually increasing EtOAc concentration to provide the Compound 3 shown in the above Scheme of this Example 3. The pure product Compound 3 was obtained as a colorless viscous oil in 48% yield (5.701 g). $^1$H NMR (600 MHz, DMSO-d6): δ (ppm) 11.80 (s, 1NH), 4.92-4.86 (m, 2H), 3.92 (t, 4H), 3.60-3.28 (m, 22H), 2.55 (t, 4H), 1.14 (d, 6H), 1.05-1.02 (m, 12)

Example 4: Synthesis of Compound 4

Compound 4

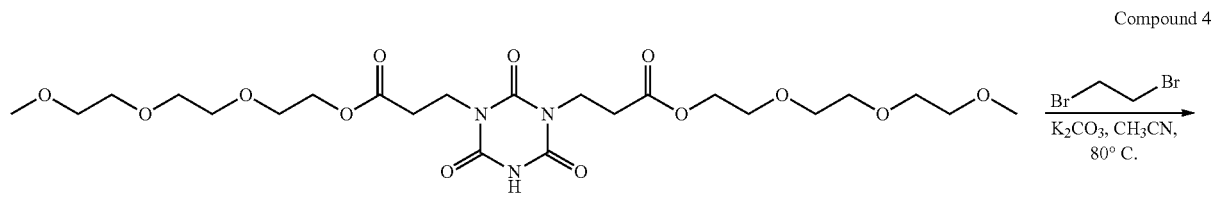

-continued

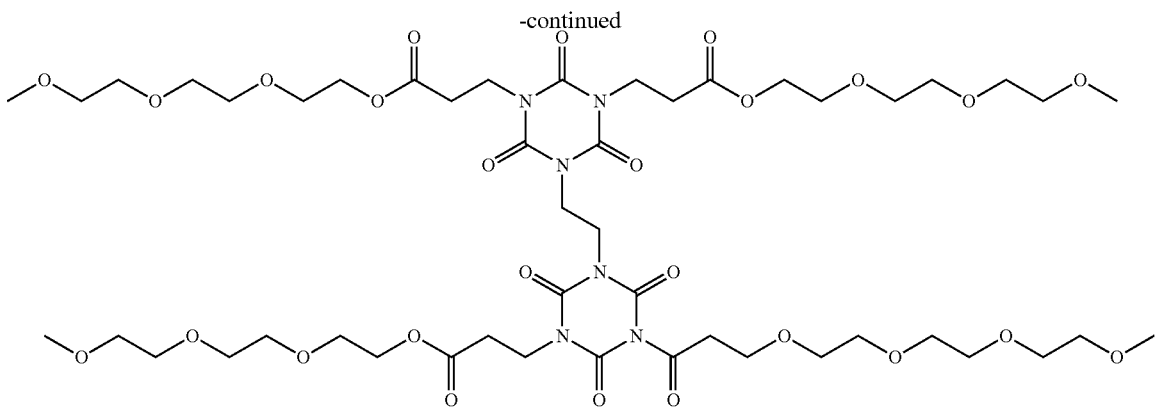

BEGIC (2.5 g, 4.47 mmol, 2 eq), in 40 ml of CH3CN was dissolved. Then 1,2-di-bromoehtane (0.19 ml, 2.23 mmol, 1 eq), K2CO3 (0.68 g, 4.91 mmol, 2.2 eq) were added to the solution and the mixture was heated at 80° C. for 16 h. After the reaction was over, liquid was removed. Around 200 ml MC/CHCl3/IPA(5/1/0.2) were used to extract with mixture and organic phase was washed by water and brine solution. After being dried by MgSO4 filtered off and concentrated under reduced pressure, the crude compound was purified by flash chromatography (MC/MeOH) to provide the Compound 4 shown in the above Scheme of this Example 4.

Examples 5 and 5A: Preparation of Coating Composition (Example 5) and Comparative Composition (Example 5A)

Coating compositions are prepared by admixing the components in the amounts shown in Table below. The prepared fluid coating compositions are filtered through a PTFE filter having a 0.45 micron pore size to provide underlying coating compositions.

TABLE

| Composition | Polymer | X-linker | Catalyst | Additive | Surfactant | Solvent |
|---|---|---|---|---|---|---|
| Example 5 | P1 (4.7 g) | C-1 (0.54 g) | T1 (43.5 mg) | Compound 1 of Example 1 (0.1 g) | F-1 (2.4 mg) | HBM (95.3 g) |
| Comparative example 5A | P1 (4.7 g) | C-1 (0.54 g) | T1 (43.5 mg) | None | F-1 (2.7 mg) | HBM (95.3 g) |

In the above Table, HBM=methyl-2-hydroxy isobutyrate; T1=p-toluenesulfonic acid ammonium salts; C-1=tetramethoxymethyl glycouril and F-1=fluorochemical surfactant Polyfox 656 from OMNOVA Solutions Inc.

P1 polymer as designated in the above Table was synthesized as follows: THEIC (Tris(2-hydroxyethyl)iso-cyanurate) (30.43 g, 116.5 mmol), TCEIC (Tris(2-carboxyethyl)iso-cyanurate) (20.11 g, 58.2 mmol), n-Butanol (20.11 g, 271.5 mmol), p-TSA (p-Toulenesulfonic acid) (0.53 g, 2.8 mmol) were dissolved in 34 g of anisole. The mixture was heated to 150° C. and maintained at that temperature for 3 hours. The reaction mixture was cooled to 120° C. and diluted by addition 78 g of HBM (2-hydroxyisobutyric acid methylester). Residual monomers were removed by precipitation with excess isopropyl alcohol resulting in the below-depicted copolymer Polymer 1 as a white powder. [Mw 7 k, PDI=1.4; THEIC:TCEIC=66:34 mol %, by $^{13}$C-NMR].

Polymer P1

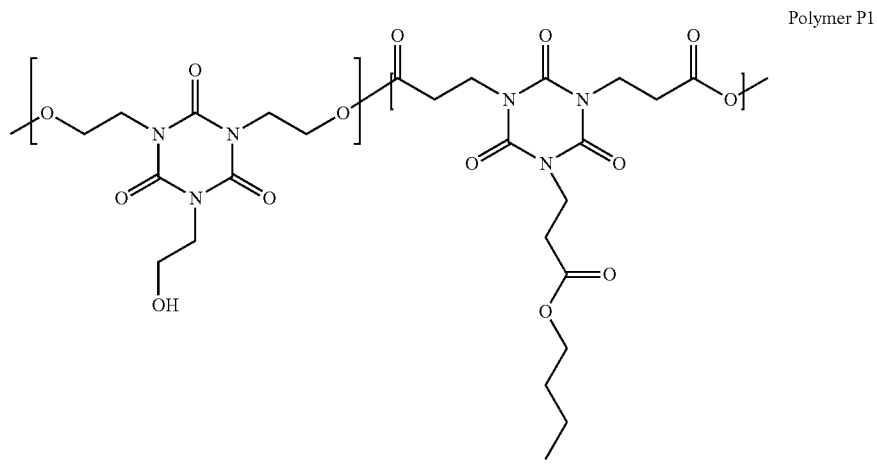

Example 6: Lithographic Processing

A 12 inch photoresist-patterned 100 nm LPCVD SiN on silicon wafer is provided. The patterns include trenches having a space of 15 nm. The coating compositions of Examples 5 and 5A are spin-coated over the patterned surface of the wafer at 1500 rpm to give a film thickness of about 100 nm. The thus applied coating compositions are heated on a hotplate at 205° C. for one minute to harden (crosslink) the coating composition. The coating composition of Example 5 showed excellent gap-fill performance without void on the topo-wafer while the coating composition of comparative Example 5A failed to fill trenches.

What is claimed is:
1. A method for forming a photoresist relief image, comprising:
   a) applying on a substrate a layer of a coating composition comprising:
      1) a resin;
      2) distinct from the resin, an isocyanurate compound that comprises a structure of the following Formula (I):

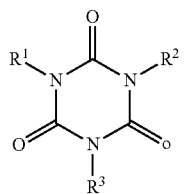

1) wherein $R^1$, $R^2$ and $R^3$ are each independently hydrogen or a substituent that comprises 1) one or more O, S, N or halogen atoms and 2) 6 or more carbon atoms, with at least one of $R^1$, $R^2$ and $R^3$ not being hydrogen; and
   b) applying a layer of a photoresist composition above the coating composition layer; and
   c) imaging the photoresist composition layer to patterned radiation and developing the imaged photoresist composition to provide a photoresist relief image.
2. The method of claim 1 wherein one or more of $R^1$, $R^2$ and $R^3$ comprises 1) one or more oxygen atoms and 2) 6 or more carbon atoms.
3. The method of claim 1 wherein at least two of $R^1$, $R^2$ and $R^3$ comprises 1) one or more oxygen atoms and 2) 6 or more carbon atoms.
4. The method of claim 1 wherein the isocyanurate compound has a molecular weight of less than 1000 daltons.
5. The method of claim 1 wherein the isocyanurate compound is non-polymeric.
6. The method of claim 1 wherein the resin comprises isocyanurate moieties.
7. The method of claim 1 wherein the coating composition further comprises a crosslinker component that is distinct from the isocyanurate compound and the resin.
8. The method of claim 1 wherein the coating composition layer is thermally treated to cure the coating composition before applying the photoresist composition layer.
9. A coated substrate comprising:
   a substrate having thereon:
   a) a coating composition comprising:
      1) a resin; and
      2) distinct from the resin, an isocyanurate compound an isocyanurate compound that comprises a structure of the following Formula (I):

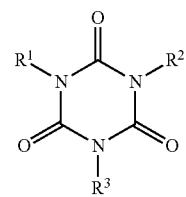

wherein $R^1$, $R^2$ and $R^3$ are each independently hydrogen or a substituent that comprises 1) one or more O, S, N or halogen atoms and 2) 6 or more carbon atoms, with at least one of $R^1$, $R^2$ and $R^3$ not being hydrogen; and
   b) a layer of a photoresist composition above the coating composition layer.
10. The substrate of claim 9 wherein two or more of $R^1$, $R^2$ and $R^3$ comprises 1) one or more oxygen atoms and 2) 6 or more carbon atoms.
11. The substrate of claim 9 wherein the isocyanurate compound has a molecular weight of less than 1000 daltons and in non-polymeric.
12. An antireflective coating composition for use with an overcoating photoresist composition, the antireflective coating composition comprising:
   1) a resin; and
   2) distinct from the resin, an isocyanurate compound that comprises a structure of the following Formula (I):

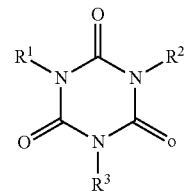

wherein $R^1$, $R^2$ and $R^3$ are each independently hydrogen or a substituent that comprises 1) one or more O, S, N or halogen atoms and 2) 6 or more carbon atoms, with at least one of $R^1$, $R^2$ and $R^3$ not being hydrogen.
13. The antireflective composition of claim 12 wherein one or more of $R^1$, $R^2$ and $R^3$ comprises 1) one or more oxygen atoms and 2) 6 or more carbon atoms.
14. The antireflective composition of claim 12 wherein at least two of $R^1$, $R^2$ and $R^3$ comprises 1) one or more oxygen atoms and 2) 6 or more carbon atoms.
15. The antireflective composition of claim 12 wherein at least one of $R^1$, $R^2$ and $R^3$ comprises a carbonyl or ketoalkyl.
16. The antireflective composition of claim 12 wherein at least one of $R^1$, $R^2$ and $R^3$ comprises a moiety $-(CH_2)_m(C=O)O((CH_2)_2O)_nCH_3$ where m is an integer of 1 to 4 and n is an integer of 1 to 12.
17. The antireflective composition of claim 12 wherein the isocyanurate compound has a molecular weight of less than 1000 daltons.
18. The antireflective composition of claim 12 wherein the isocyanurate compound is non-polymeric.
19. The antireflective composition of claim 12 wherein the resin comprises isocyanurate moieties.

20. The antireflective composition of claim 12 further comprising a crosslinker component that is distinct from the isocyanurate compound and the resin.

* * * * *